(12) United States Patent
Kaal et al.

(10) Patent No.: US 9,584,048 B2
(45) Date of Patent: Feb. 28, 2017

(54) ELECTROACTIVE ELASTOMER CONVERTER

(75) Inventors: William Kaal, Darmstadt (DE); Sven Herold, Gross-Umstadt (DE); Tobias Melz, Darmstadt (DE)

(73) Assignee: FRAUNHOFER-GESELLSCHAFT ZUR FORDERUNG DER ANGEWANDTEN FORSCHUNG E.V., Munich (DE)

( * ) Notice: Subject to any disclaimer, the term of this patent is extended or adjusted under 35 U.S.C. 154(b) by 168 days.

(21) Appl. No.: 13/880,076

(22) PCT Filed: Sep. 30, 2011

(86) PCT No.: PCT/EP2011/004930
§ 371 (c)(1),
(2), (4) Date: Apr. 18, 2013

(87) PCT Pub. No.: WO2012/052114
PCT Pub. Date: Apr. 26, 2012

(65) Prior Publication Data
US 2013/0207522 A1     Aug. 15, 2013

(30) Foreign Application Priority Data
Oct. 22, 2010     (DE) .................. 10 2010 049 301

(51) Int. Cl.
*H01L 41/047* (2006.01)
*H02N 2/18* (2006.01)
(Continued)

(52) U.S. Cl.
CPC ......... *H02N 2/18* (2013.01); *B60G 17/01941* (2013.01); *F16F 1/3605* (2013.01);
(Continued)

(58) Field of Classification Search
CPC . H01L 41/113; H01L 41/047; H01L 41/0471; H01L 41/0986; B60G 17/01941
(Continued)

(56) References Cited

U.S. PATENT DOCUMENTS 5,122,993 A * 6/1992 Hikita ................... B06B 1/0625
310/366
6,543,110 B1     4/2003 Pelrine et al.
(Continued)

FOREIGN PATENT DOCUMENTS

EP           0 614 705 A2   9/1994
WO    WO 2007/029275 A1   3/2007

OTHER PUBLICATIONS

Kovacs, G. et al: "Stacked Dielectric Elastomer for Tensile Force Transmission", Sensors and Actuators A: Physical, vol. 155, No. 2, Oct. 1, 2009, pp. 299-307; XP026708397, ISSN: 0924-4247.
Huu Chuc, Nguyen et al: "Multi-Stacked Artificial Muscle Actuator Based on Synthetic Elastomer", Proceedings of the 2007 IEEE/RSJ International, Conference on Intelligent Robots and Systems, San Diego, CA, USA, Oct. 29Nov. 2, 2007, pp. 771-776.

*Primary Examiner* — Derek Rosenau
(74) *Attorney, Agent, or Firm* — Fitch, Even, Tabin & Flannery LLP

(57) ABSTRACT

An electroactive elastomer converter is described comprising at least one electroactive elastomer layer (3) with a top side and underside and an electrically conductive electrode body (1') that is two-dimensionally connected to the top side at least in regions. An electrically conductive electrode body (1') is dimensionally connected in at least two regions to the underside. At least one electrode body (1') in each case has an electrode surface facing the elastomer layer (3). At least one opening (2) is present to which an two-dimensional region in which there is no two-dimensional bond between the elastomer layer (3) and the electrode body (1'). A compressible medium is provided in the area of the opening.

31 Claims, 7 Drawing Sheets

(51) Int. Cl.
  *B60G 17/019*    (2006.01)
  *F16F 1/36*      (2006.01)
  *H01L 41/09*     (2006.01)
  *H01L 41/113*    (2006.01)
  *H01L 41/193*    (2006.01)

(52) U.S. Cl.
  CPC ........ *H01L 41/047* (2013.01); *H01L 41/0471* (2013.01); *H01L 41/0986* (2013.01); *H01L 41/113* (2013.01); *B60G 2202/424* (2013.01); *B60G 2401/11* (2013.01); *B60G 2500/22* (2013.01); *H01L 41/193* (2013.01)

(58) Field of Classification Search
  USPC .................................... 310/328, 365, 366
  See application file for complete search history.

(56) References Cited

U.S. PATENT DOCUMENTS

| | | | |
|---|---|---|---|
| 7,288,878 B1* | 10/2007 | Feller | 310/364 |
| 2007/0114885 A1 | 5/2007 | Benslimane et al. | |
| 2008/0093952 A1* | 4/2008 | Biegelsen | 310/317 |
| 2008/0191585 A1* | 8/2008 | Pelrine | F02G 1/043 |
| | | | 310/363 |
| 2009/0230823 A1* | 9/2009 | Kushculey | A61N 7/02 |
| | | | 310/366 |
| 2010/0282874 A1* | 11/2010 | Nakamura et al. | 310/366 |

\* cited by examiner

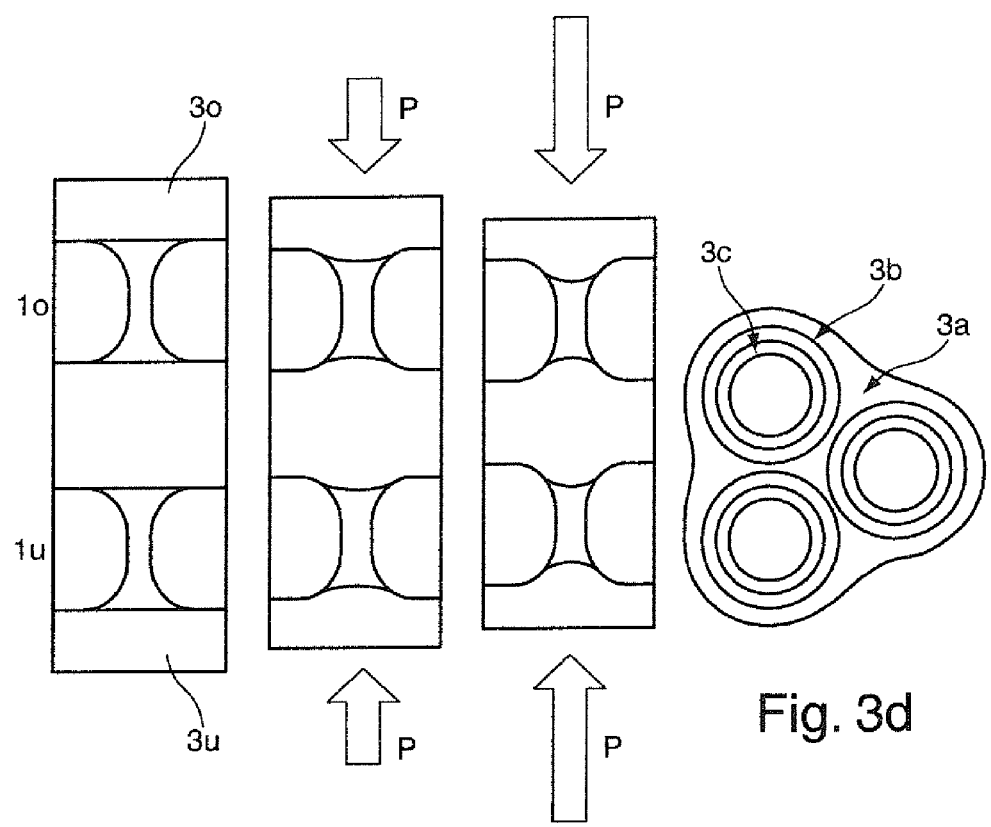

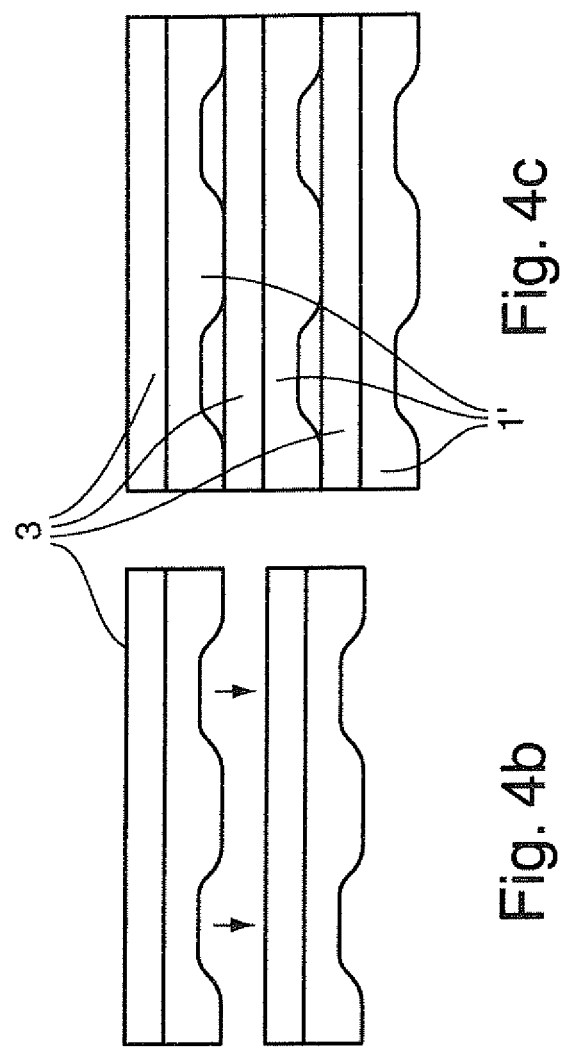

ELECTROACTIVE ELASTOMER CONVERTER

CROSS REFERENCE TO RELATED APPLICATION

Reference is made to German Patent Application Serial No. DE 10 2010 049 301.5, filed Oct. 22, 2012, which application is incorporated herein by reference in its entirety.

BACKGROUND OF THE INVENTION

Field of the Invention

The invention relates to an electroactive elastomer converter that comprises at least one electroactive elastomer layer having a top side and underside, and also an electrically conductive electrode body two-dimensionally connected to the top side at least in regions and an electrically conductive electrode body two-dimensionally connected to the underside at least in regions, wherein at least one electrode body in each case has an electrode surface facing the elastomer layer, and in which at least one opening is present to which a region in which there is no bond between the elastomer layer and the electrode body can be assigned.

Description of the Prior Art

Electroactive elastomer converters provide at least two electrode bodies that are arranged at a distance from each other and are usually of layered construction, between which a layer of dielectric elastomer is inserted, which has exceptional elongation properties, typically of over 300%. Elastomer converters of such kind are very often constructed in the form of a multilayer stacked structure of a plurality of elastomer and electrode layers in an alternating layer sequence. The stacked structure thus contains the elastomer layers of dielectric elastomer material, each in a two-dimensional bond between two electrode layers and which elastomer layers form a capacitive stacked structure. The application of a suitably selected electrical voltage to the electrode layers creates attractive electrostatic forces between the electrode layers, which in turn cause the elastomer layers to be compressed, particularly in the thickness direction. Due to the stacked construction of the converters, the changes in thickness of all of the elastomer layers present in the multilayer stacked structure are added together until they represent a change in the travel path that is useful for actuation purposes. On the other hand, a mechanical deformation of such a multilayer stacked structure in the thickness direction of the individual elastomer layers results in a change in capacitance of the capacitive stacked structure, which is useful for electrical energy generation or an electrical signal pick-up.

Elastomer converters of such kind that function according to the "Maxwell voltage effect" use non-compressible elastomers, which change shape according to their design and elongation properties but retain their tare volume when exposed to compressive forces. In order to match the lateral by orientated lengthwise extending capabilities of elastomer layers within a multilayer stacked structure, the electrode layers, which are each in a two-dimensionally bonded structure with the elastomer layers, have lateral expansion properties.

WO 2007 029275 A1 describes an electroactive polymer based actuator with a stacked structure and having an electroactive polymer in a strip having strip surfaces respectively contacted by a two-dimensionally elastic flat electrode to form a strip-like layer structure that is folded in serpentine form to provide a plurality of layered structure plies arranged one on top of the other in a stack. When an electrical voltage is applied to the flat electrodes, the compressive forces in the direction of the layer thickness act on the individual electroactive polymer layer plies so that the actuator is able to contract in controlled manner in the direction of the layer thickness.

The use of expandable electrode layers for constructing stacked elastomer multilayer converters using synthetic dielectric elastomer layers emerges from an article by Chuc, Nguyen Huu; Park, Jong Kil; Thuy, Doan Vu; Kim, Hyon Seok; Koo, Ja Choon; Lee, Youngkwan et al. (2007): Multi-stacked Artificial Muscle Actuator Based on Synthetic Elastomer. In: Proceedings of the 2007 IEEE/RSJ International, pages 771-776. In particular, the article describes elastomer converter systems with annular or rectangular elastomer and electrode layers.

U.S. Published Application 2007/0114885 A1 describes an elastomer multilayer stacked actuator having thin metal electrode layers. While the electrode layers are not stretchable due to the material they are made from, their corrugated structure enables them to undergo deformation along a preferred spatial axis.

U.S. Pat. No. 6,543,110 B1 discloses an elastomer multilayer stacked actuator, as illustrated in FIG. 2G, which provides multiple elastomer layers arranged on top of each other in a stack. Each layer is connected by an adhesive layer incorporating a spatially discontinuous electrode layer for activating the elastomer layers. In this way, the elastomer layers are bounded directly either by the adhesive layer or by the electrode surfaces.

The article by G. Kovac, L. During, S. Michel, G. Terrasi, "Stacked Dielectric Elastomer Actuaro for Tensile Force Transmisson", Sensor and Actuators A 155 (2009), pages 299-307, contains a representative overview of the related art in terms of elastomer stack converters, all of which provide for the use of elastic electrode layers.

By virtue of the two-dimensionally elastic properties of both their elastomer and electrode layers, the known electroactive elastomer converter systems allow relatively large travel paths or changes in layer thickness. However, the dynamic response or operating characteristics of elastomer converters of this kind is limited to the individual layers by their two-dimensionally elastic properties both in the lengthwise elongation and in the direction of thickness. This applies particularly to the frequency range with which it is possible to recover electrical energy or electrical useful signals from mechanical movements, particularly vibrations, using known elastomer converters.

SUMMARY OF THE INVENTION

The invention provides an improved electroactive elastomer converter comprising at least one electroactive elastomer layer having a top side and underside, and an electrically conductive electrode body which is two-dimensionally connected to the top side at least in regions and an electrically conductive electrode body two-dimensionally connected to the underside at least in regions. At least one electrode body in each case has an electrode surface facing the elastomer layer, and in which at least one opening is present to which a two-dimensional region in which there is no two-dimensional bond between the elastomer layer and the electrode body is such that the dynamic response of the elastomer layers, which are preferably connected to each other and to the electrode bodies interposed between them in a layer structure, is improved to provide conversion of mechanical vibration energy into electrical energy even at high vibration frequencies.

Conversely, the invention performs high-frequency travel path changes in the layer thickness in response to applied high-frequency electrical voltage excitation at the electrode layers.

An electroactive elastomer converter has a compressible medium, preferably a gas, for example air, in the region of the opening. The pressure conditions under which the compressible medium interacts cooperatively with the free surface of the elastomer layer in the region of the opening preferably correspond to atmospheric ambient pressure conditions, for example standard normal pressure conditions, preferably 1013 hPa. Depending on requirements and the intended application of the elastomer converter, the pressure conditions may be adjusted to differ from ambient pressure conditions to be set so that, for example, positive pressure or negative pressure or vacuum conditions prevail. To this end, a volume surrounding the opening must be encapsulated appropriately, as will be explained in detail later.

The term "electrode body" is to be understood as an electrode having an essentially layered structure which is not limited only to the size dimensions of electrode layers having a film or foil construction and including macroscopic layer thickness dimensions such as occurring, for example, in metal sheets. Unlike previous elastic electrode layers, with which the two-dimensional contact to adjacent elastomer layers should be as complete as possible, the electrode layers of the invention have openings in the form of holes or perforations that pass completely through the electrode layers, or at least with concave recesses that are provided on at least one electrode layer surface as local depressions. The filling according to the invention with air or another compressible medium of the holes or openings within the electrode layers or electrode bodies, each of which is bordered on one or both sides by elastomer layers, has an advantageous effect on the elongation and rigidity behavior of the elastomer converter. Alternatively, it is possible to provide a vacuum or negative pressure in the region of the holes or recessed openings, which exerts a mechanical pretension on the elastomer layer between the two electrodes.

In order to incorporate certain pressure conditions inside the openings of an electrode body, any number of stacked electroactive elastomers are arranged one on top of the other. An electrode body, preferably in the form of a film or foil-like construction, is interposed between each elastomer layer. At least one side facing an adjacent elastomer layer is furnished with at least one opening, and the compressible medium such as air is included in the opening.

In a preferred embodiment, the electrode layers in the stacked layer structure have holes or perforations. The electrode layers have a metal material possessing good electrical conductivity which have little or no two-dimensionally elastic properties. The electrode layers are "non-deformable" at least with respect to the area extent thereof. The term "non-deformable" is understood to mean the electrode layers arranged between each of the electroactive elastomer layers have an electrically highly conductive material, preferably a metal such as copper, aluminium, steel, nickel or the like, which has an e-modulus at least four orders of magnitude greater than the e-modulus of the electroactive elastomer layers, which are preferably made from silicons or PU elastomers. When a mechanical pressure, which may be created either by external mechanical force of by an electrical field, is applied to a stacked layer structure of the invention in the thickness direction of the stacked structure, the holes or perforations provided in the electrode layers each allow the otherwise non-compressible elastomer to penetrate locally, thereby resulting in the macroscopic compressibility of the layer structure as a whole in the direction of thickness. The tendency of the elastomer layers interposed between the electrode layers to expand with respect to the area extent thereof is suppressed by the two-dimensional rigidity of the individual electrode layers.

The use of electrode bodies with a layered structure and which have a concave opening or concave contour as a recess at least on the electrode surface facing toward the elastomer layer is an alternative to the use of electrode layers provided with holes or perforations. The recess functions as an expansion space into which the non-compressible elastomer of the elastomer is able to expand locally in the direction of thickness under mechanical pressure in the same way as the holes or perforations described in the preceding. The concave recesses inside the electrode bodies are a gas-tight closure with the surface of each elastomer layer. Thus a volume is enclosed containing the compressible medium under certain pressure conditions.

Typical whole dimensions or maximum diameters of the openings in the layer-like electrode bodies described in the preceding are preferably in the same order of magnitude as the layer thickness of the electrode layer and the electrode body and the elastomer layer.

In general, the geometric shape of the holes or recessed openings is not subject to any special requirements, although it is advantageous to provide rounded contours particularly in the transition zones from the hole to the electrode layer surface and in the rim areas of the recessed openings in order to avoid material cracks within the elastomer layer. Provision of round transitions at the edges of the holes or recesses in particular helps to ensure continuous surface contact between the elastomer layers and the electrode layers in the area of the holes or recesses. This in turn enables measurably significant capacitance changes to occur for small travel paths. That small changes in thickness enable energy to be converted at high frequencies. Consequently, especially when the electrical voltage increases or an increasing mechanical pressure is applied from the outside to a multiple stack arrangement, the extent of the abutting two-dimensional zones of the individual elastomer layers against the interiors of the holes and recesses also increases resulting in both the electrical capacitance and the mechanical rigidity of the stack structure being caused to increase. It thus becomes possible to plot progressive rigidity and capacitance curves as a function of the geometrical nature of the holes or recesses. That makes an electroactive elastomer converter constructed according to the invention highly suitable for use as an adaptive dynamic vibration absorber so that a vibration absorbing element having the resonant vibration behavior may be tuned or is adjustable in targeted manner by quasistatic actuation.

A further use of the electroactive elastomer converter constructed according to the invention is as a flat-panel loudspeaker or an actively adjustable wall impedance, in which an electrical control voltage is applied between at least two electrode bodies adjacent on both sides to at least one elastomer layer to cause defined vibration in the layered elastomer converter for generating audio signals or to provide sound damping in rooms or objects. The at least two electrode bodies are advantageously positioned along an upper and/or lower side of an elastomer layer and spatially separated from one another. A different electrical voltage may be applied to the electrode bodies in order to influence the vibration behavior of the elastomer converter individually over the entire area thereof. Further details in this respect will be discussed in the following in conjunction with the explanation of the illustrated embodiments.

BRIEF DESCRIPTION OF THE DRAWINGS

In the following, the invention will be described for exemplary purposes and without limitation on the basis of embodiments thereof and with reference to the drawings. In the drawings:

FIGS. 3*a*, *b* and *c* represent longitudinal sections through an electroactive elastomer converter constructed according to the invention with perforated electrode layers having rounded hole edges in various pressure states;

FIGS. 4*a*, *b* and *c* show an electroactive elastomer converter constructed according to the invention with layered electrode bodies, in which concave, recessed openings have been created;

DETAILED DESCRIPTION OF THE INVENTION

In a simplest embodiment of the electroactive elastomer converter constructed according to the invention, only one elastomer layer is provided and is interposed between two electrode layers furnished with holes or openings.

Figure 1A:
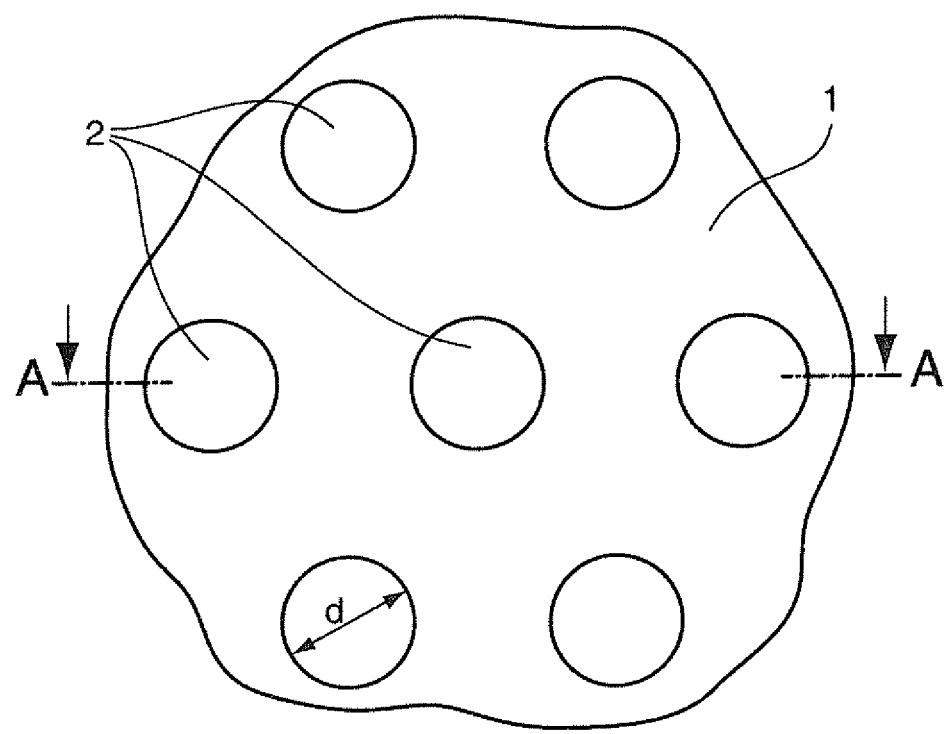
FIGS. 1 *a* and *b* show a top view and longitudinal cross section through an electrode layer constructed according to the invention.
Figure 1B:
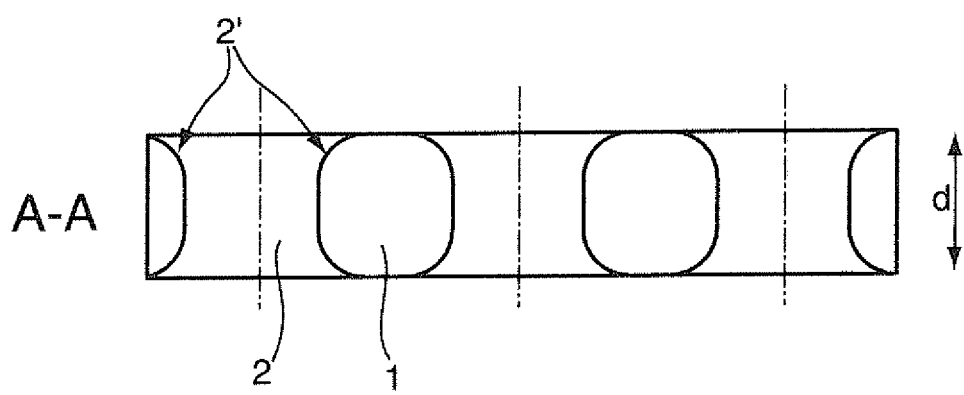

FIG. 1*a* shows a top view of an area of an electrode layer 1, perforated by holes 2, and which may be in the form of a metal sheet or a metal foil. The holes 2 created in electrode layer 2 have rounded contours at the hole edges 2' thereof, as is shown in the longitudinal section according to FIG. 1*b*. FIG. 1*b* represents longitudinal section AA through the sectional plane AA shown in FIG. 1*a*.

Electrode layer 1 that is perforated with holes 2 typically has a layer thickness of least several μm. Diameters d of the holes 2 created in electrode layer 1 are approximately equal to those in the electrode layer or the elastomer layer.

Figure 2B:
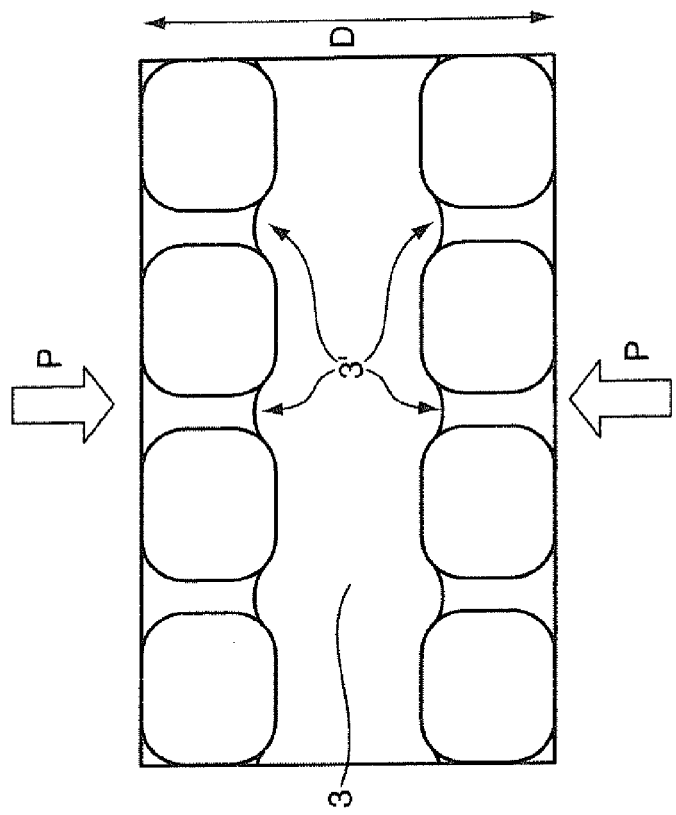
FIGS. 2*a* and *b* represent cross sections through a layer arrangement of two perforated electrode layers with an elastomer layer therebetween, with no applied pressure a) and with pressure applied b) in the direction of the layer thickness.
Figure 2A:
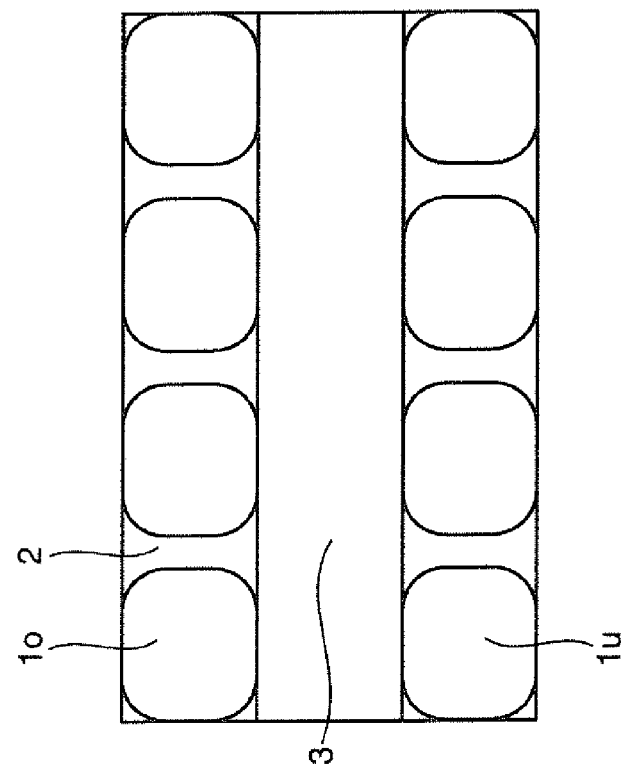

FIG. 2*a* shows a simplest embodiment of an electroactive elastomer converter having the structure according to the invention. A dielectric elastomer layer 3 is interposed between two of the electrode layers 1*u* and 1*o* as described in the preceding, furnished with holes, and together with the two electrode layers forms a tight area bonded structure within the respective contact zones, that is the electrode surface areas surrounding holes 2. The two-dimensional bond between individual electrode layers 1*u* and 1*o* and the elastomer layer 3 located between them ensures that the layers are bonded together in such manner that they are "immovable" in the layer longitudinal extension. There is no corresponding adhesive bond between the free surface areas of elastomer layer 3 located inside hole openings 1 and the electrode layers 1*u* and 1*o*. The adhesive bond between the two electrode layers 1*u* and 1*o* and the elastomer layer 3 positioned therebetween, as illustrated in cross section in FIG. 2*a* represents a state in which no external forces of any kind are acting on the adhesive bond. In contrast thereto, in the representation of the cross section according to FIG. 2*b* it is assumed that a mechanical pressure p acts on elastomer layer 3 in the direction of the thickness. The mechanical pressure may either be caused by an external mechanical load on the layer structure, or it might also be created by an electrical field which is generated by corresponding electrical pretension between the two electrode layers 1*u* and 1*o*. Due to the non-compressibility of dielectric elastomer 3 and the prevention of any area lengthwise extension of elastomer layer 3 due to its immovable adhesive bond with upper and lower electrode layers 1*o* and 1*u* as described previously, the non-compressible elastomer is only able to expand locally, into the holes provided in electrode layers 1*u* and 1*o*, as may be inferred from local deformations 3' of elastomer layer 3 shown in FIG. 2*b*. The process of local migration of elastomer components that are closest to the surface towards the area of holes 2 inside individual electrode layers 1*o* and 1*u* has the effect of reducing thickness D of the overall layer structure shown in FIG. 2*b* due to compression, without significantly stretching the area lengthwise extent of the elastomer layer.

The layer structure with one elastomer layer 3 having two electrode layers 1*u* and 1*o* furnished with holes or perforations shown in each of FIGS. 2*a* and 2*b* may be combined in a stacked construction with many other elastomer and electrode layers to obtain a multilayer stacked structure with a layer sequence of alternating elastomer layers and perforated electrode layers. In a multilayer sequence of such kind, the cumulative effect of the thickness changes of all the elastomer layers in response to the effect of a corresponding mechanical pressure as shown in FIG. 2*b* results in a scalable, macroscopic change in thickness of the entire stacked structure, which can be used in an actuator application as the actuator travel path.

The electroactive elastomer converter may be operated as an actuator or a sensor depending on the intended application or use. If it is operated as an actuator, electrical energy is converted directly into kinetic energy, which is ultimately realized as a dynamic change in the travel path. In this case, it is expedient to apply an electrical voltage between two electrode layers to create an electrostatic field between the two electrode layers, so that both are drawn together by electrostatic forces of attraction. This causes the elastomer layer between the two electrode layers to be compressed as described earlier, and the layer structure becomes shorter or less thick than its original state. The intrinsic two-dimensional rigidity of the electrode layer material with holes or perforations and associated deformability of the elastomer layer enclosed between the two electrode layers that takes place almost exclusively in the thickness direction of the elastomer layers enable dynamic travel path and thickness changes to take place that are not achievable with the comparable stacked actuators using two-dimensionally elastic electrode layers that have been in common use until now. Even though smaller thickness changes and correspondingly smaller travel path changes are possible, the novel elastomer converter is capable of converting immeasurably higher frequency electrical voltages into mechanical thickness oscillations than has been possible until now. This is mainly because the elastomer layers perform their deformation function only in the areas of the openings or holes, and not over their entire lateral periphery, as has been the case.

On the other hand, if the elastomer converter constructed according to the invention is to be operated as a sensor, that is to say mechanical vibration energy is to be converted into electrical energy, the dynamic deformation of the elastomer layer in the regions around the holes enhances the dynamic change in the contact surface between the elastomer layer and the electrode layers. Since the electrode layers with an elastomer layer interposed between them may be treated as a capacitor arrangement, the capacitance of the capacitor arrangement varies according to the different two-dimensional contacts between the elastomer layer and the electrode layers, and this ultimately causes a change in voltage that is not only measurable but can also be sensed at the electrode layers. Since the compressibility of the elastomer layer is practically exclusively in the thickness direction, even small changes in the thickness of the elastomer layer result in large changes in capacitance, which can be read as electrical signals with measuring equipment. One particularly important advantage of the elastomer converter according to the invention is that it is capable of converting high-frequency mechanical vibrations with small amplitudes into signals that can be measured and recorded electrically.

FIG. 3a shows as partial cross section through a layer structure that is similar to the layer sequence of FIG. 2a, but to which two additional elastomer layers, that is to say one upper and one lower elastomer layer 3o and 3u have been added in the manner shown. In this way, the perforated electrode layers 1u and 1o are each delimited on either side by elastomer layers 3u and 3o, and holes 2 in electrode layers 1u and 1o are closed off in gas-tight manner. Accordingly, it becomes possible to enclose air or another compressible medium in holes 2, a medium that would be conceivable for such would be a medium with a high dielectric number in order to improve the definition of the electrical field between and within the individual electrode layers. Alternatively, the provision of a vacuum or negative pressure in the spaces 2 that are included by elastomer layers 3u and 3o might be considered, for example by performing the process of joining the individual layers under vacuum conditions in order to produce a mechanical pretension between the individual elastomer layers. A mechanical pretension of such kind might be used to advantageously during operation as an actuator, because then tensile forces can also be applied without pulling the two-dimensional bond apart.

Starting from the layer structures represented in FIG. 3a, in which no mechanical pressure is acting on the elastomer layers, a mechanical pressure p of increasing strength is applied to the layer structure as shown in FIGS. 3b and 3c, thereby causing increasing deformation of the individual elastomer layers in the areas of each of the holes, so that the two-dimensional contact between elastomer layers 3u and 3o is also realized with increasing pressure strength P. FIG. 3d shows the various contact surfaces that correspond according to FIGS. 3a, 3b and 3c. As mechanical pressure p on the layer structure increases as a result of a rising electrical voltage between the individual electrode layers or the application of increasing external pressure, the contacting surface areas are also enlarged, with an associated increase in electrical capacitance and mechanical rigidity. In this way, progressive rigidity/capacitance curves may be plotted for the layer structure depending on the geometrical nature of holes 2. The largest surface area contact between elastomer layers and electrode layers exists in the case shown in FIG. 3c, that is to say this case represents the state of greatest capacitance and rigidity. In contrast, the layer structure illustrated in FIG. 3a has the lowest rigidity and the smallest surface area contact, and therewith also the lowest capacitance.

As an alternative to constructing the electrode layers or bodies with continuous holes or perforations, it is also possible to provide at least one side of the electrode layers with recessed openings. FIG. 4a shows a cross sectional view of an electrode body 1' of such kind, which is connected on one side to an elastomer layer 3. Electrode body 1' has a structured surface 1s in which recessed, concave openings 4 have been created. In the embodiment shown in FIG. 4a, electrode body 1' has a smooth upper side opposite structured upper side 1s, and the smooth upper side is connected to elastomer layer 3. Openings 4 can be created in the surface of electrode body 1' by stamping or rolling. Due to the smooth construction of electrode body 1' opposite structured surface 1s, elastomer layer 3 may be applied by knife coating or spraying. This enables very thin layer thicknesses to be created. The layer structure represented in FIG. 4a represents a kind of semi-finished product that can be assembled by placing one or more such semi-finished products on top of it in a stacking arrangement, as is indicated by the cross sections represented in FIGS. 4b and 4c. FIG. 4c represents an elastomer converter that is indefinitely expandable with three semi-finished products according to FIG. 4a each stacked one on top of the other. In this case also, elastomer layers 3 are able to deform into the concave openings in the individual electrode bodies 1' when mechanical force is applied.

Figure 5:
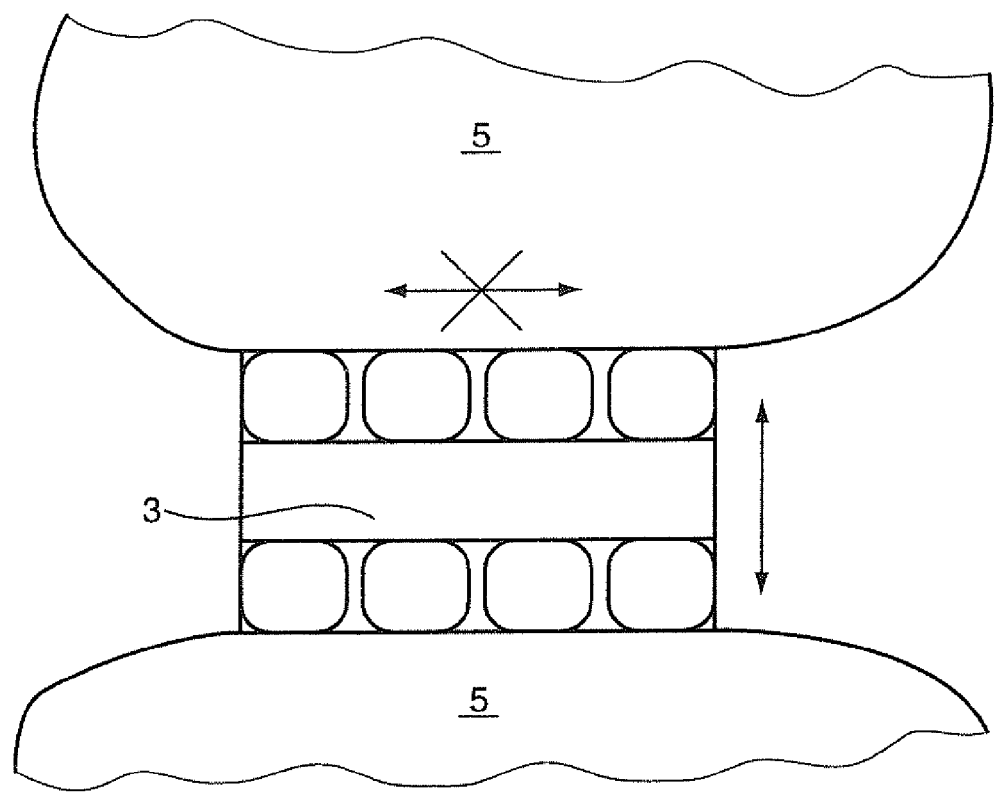
FIG. 5 shows an electroactive elastomer converter between two solid counterbearings.

The two-dimensional area and longitudinal non-deformabilities of the electrode bodies mean that an elastomer converter constructed according to the invention is able to connect directly to an enormous range of periphery contours 5, as is shown in FIG. 5. For example, stack converters with a small number of layers, as is the case in FIG. 5, can even be used for practical purposes with just a single elastomer layer 3, since no parasitic boundary effects occur when they are attached to peripheral retaining or supporting structures. This assures a decisive advantage over conventional, stretchable electrodes.

The elastomer converter according to the invention enables a technologically simple, robust and inexpensive construction approach base on the use of two-dimensionally rigid electrode layers, preferably in the form of metal electrodes. Because of the longitudinally rigid edge electrodes, which are located on the outside in each case, as shown in FIG. 5, mounting effects that may interfere with the converter system can be avoided altogether.

Figure 6:
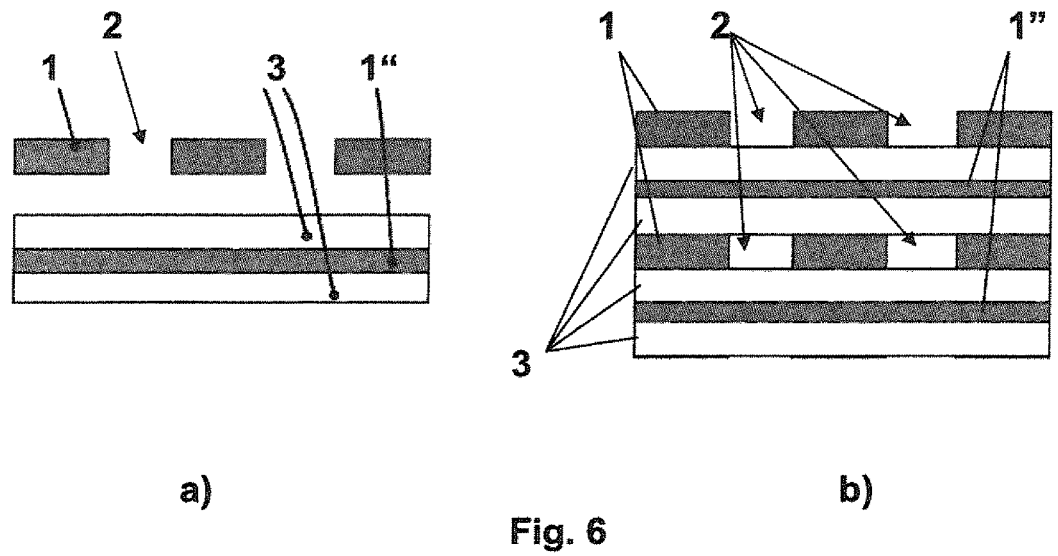
FIGS. 6 *a* and *b* show manufacturing steps for an inexpensive elastomer converter with stacked structure.

FIGS. 6a and 6b show a further embodiment for producing an electroactive elastomer converter, which is notable for the particularly inexpensive production method thereof. Starting with an interrupted electrode layer construction, that is to say without any openings in the form of holes or recesses, such as is available as a conventional metal foil, a thin elastomer layer 3 is deposited on each of the two electrode layer surfaces. On this three-layer structure, an electrode layer 1 furnished with openings, in this case in the form of holes 2, is deposited on the surface of at least one elastomer layer 3. An elastomer converter layer stack of this kind, having four layers, thus forms a kind of basic stack module, with which an elastomer converter may be created by repeating the stacking arrangement on the basic stack module any number of times, such as is shown in FIG. 6b with only two basic stack modules arranged on top of one another in each case. The elastomer converter that is producible in this manner comprises alternating stacking sequences of an electrode layer 1" without holes and an electrode layer 1 with holes, which are separated in each case by an elastomer layer 3.

The embodiment illustrated in FIG. 6b shows the electrode layers 1 with holes and aligned in the stacking direction with respect to each other such that the openings thereof, in this case in the form of holes 2, are arranged so that they overlap each other completely in the stacking direction. However, an arrangement whereby openings 2 in the respective electrode layers 1 fully overlap each other is not absolutely essential. It is also possible to influence the macroscopic stretching behavior of the elastomer converter as a whole by offsetting the openings or holes 2 laterally with respect to each other within the individual electrode layers 1 with holes. In this way, the lateral position of the perforated electrode layers 1 relative to each other affects the mechanical, the electrical and the electromechanical properties of the entire converter element.

Figure 7:
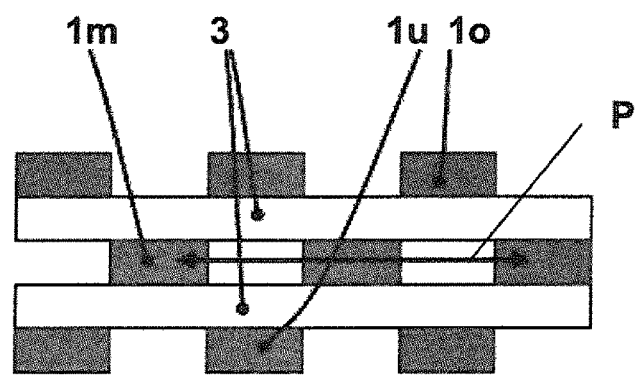
FIG. 7 shows an elastomer converter with electrode layers in offset alignment with respect to each other and furnished with openings.

FIG. 7 shows a layer construction of an elastomer converter constructed according to the invention, in which electrode layers 1o, 1m and 1u with holes are each separated from one another by an elastomer layer 3. The middle perforated electrode layer 1m is positioned such that the holes 2 thereof are offset laterally with respect to the holes in upper electrode layer 1o and lower electrode layer 1u, with the result that the holes do not overlap each other in the stacking direction. The lateral shift of the middle electrode layer 1m relative to upper and lower electrode layers 1o and 1u, indicated by horizontal arrow P, is intended to show that the lateral offset may be varied depending on the macroscopic mechanical, electrical and electromechanical properties sought.

Figure 8:
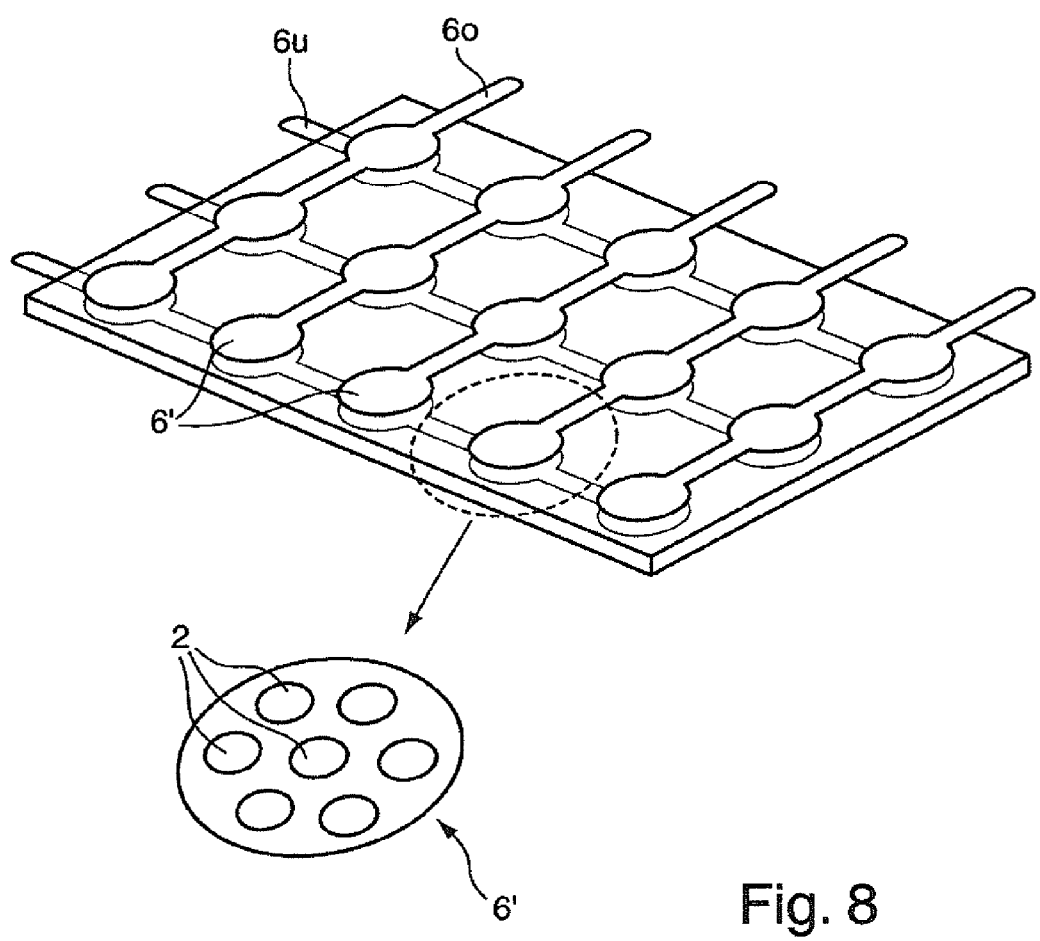
FIG. 8 shows an embodiment of an electroactive elastomer converter designed for use in a haptically operable key field.

FIG. 8 shows an embodiment of an electroactive elastomer converter that has the form and function of a haptically operable key field. The elastomer converter comprises an elastomer layer 3 with multiple strip-like electrode layers 6o and 6u arranged on the upper and lower sides thereof, each of which being arranged to be separated from one another, and each being furnished with a plurality of circular electrode fields 6'. The circular electrode fields 6', which are positioned along each of the strip-like electrode layers 6o and 6u on both the upper and lower side of elastomer layer 3, are each arranged to overlap one another in pairs. Each pair thus forms a converter module. Each individual circular electrode surface 6' is furnished with openings in the form of perforations or holes 2, as is shown in the enlarged image in FIG. 8. The size, number and arrangement of holes 2 on a circular electrode field 6' may be identical or chosen independently for each individual electrode field 6'.

As was mentioned earlier, the arrangement shown in FIG. 8 can be used to create a haptically operable key field by linking the positionally selective capture of changes in capacitive conditions in the area of each converter module to a given function, which can be initiated by actuating the respective converter module.

The individual converter modules, each having two electrode surfaces 6' arranged so as to be separated from one another by a shared elastomer layer 3, each use the shared elastomer layer 3 and are thus connected to each other closely.

The arrangement may also be used as an actuator/sensor field depending on how the individual converter modules are supplied with the same or different control voltages via the individual electrode layers 6o and 6u or are connected to corresponding detector units.

With the arrangement principle suggested in FIG. 8, just one or multiple stacked elastomer layers 3, between each of which the electrode layers 6o and 6u are interposed as shown in FIG. 8, may be used to construct large-area, thin actuators that can be used as flat loudspeakers or actively controllable and adjustable wall resistors. Such flat actuators can be integrated in space-saving manner in large, flat structures.

The elastomer converter constructed according to the invention is also ideal for use as a vibration damping system in technical systems and structures, for example particularly in the automotive industry, machine and plant construction. The elastomer converter constructed according to the invention is also and particularly well suited for use in recovering energy from vibrations which is a process known as energy harvesting.

LIST OF REFERENCE SIGNS

1 Electrode layer
1' Electrode body
1u Lower electrode layer
1o Upper electrode layer
1s Structured surface
2 Hole
2' Hole rim or hole rim area
3 Elastomer layer
4 Groove-like or concave opening
5 Peripheral contour
6' Electrode field
6o and 6u Electrode layer

The invention claimed is:

1. An electroactive elastomer converter comprising: at least one electroactive elastomer layer having a top side and underside and an electrically conductive electrode body connected in an area to the top side at least in regions, an electrically conductive electrode body connected in an area to the underside at least in regions, at least one electrode body including an electrode surface facing the elastomer layer with at least one opening including a two-dimensional region which is not bonded between the elastomer layer and the electrode body and into which the elastomer penetrates upon application of pressure thereto into the at least one opening and the at least one opening being bordered on one side by the elastomer layer with a gaseous compressible medium disposed in the at least one opening, and wherein the at least one opening facing the elastomer layer has a concave shape providing at least one recess in the electrode surface and each of the at least one recess and the elastomer layer encloses a gas-tight volume containing the gaseous compressible medium.

2. An electroactive elastomer converter according to claim 1, wherein the electrode body is metallic.

3. An electroactive elastomer converter according to claim 1, wherein the electrode body has an e-modulus at least four orders of magnitude greater than an e-modulus of the elastomer layer.

4. An electroactive elastomer converter according to claim 2, wherein the electrode body has an e-modulus at least four orders of magnitude greater than an e-modulus of the elastomer layer.

5. An electroactive elastomer converter according to claim 1, wherein the electrode body comprises an electrically conductive layer with the at least one opening being a hole or perforation passing completely through the electrically conductive layer.

6. An electroactive elastomer converter according to claim 2, wherein the electrode body comprises an electrically conductive layer with the at least one opening being a hole or perforation passing completely through the electrically conductive layer.

7. An electroactive elastomer converter according to claim 3, wherein the electrode body comprises an electrically conductive layer with the at least one opening being a hole or perforation passing completely through the electrically conductive layer.

8. An electroactive elastomer converter according to claim 1, wherein the electrode body comprises an electrically conductive layer with the at least one opening being a hole or perforation passing completely through the electrically conductive layer.

9. An electroactive elastomer converter according to claim 1, wherein the at least one opening in the electrode body electrode surface facing the elastomer layer has a concave shape, providing a recess in the electrode surface.

10. An electroactive elastomer converter according to claim 1, wherein the at least one opening in the electrode body electrode surface facing the elastomer layer has a concave shape, providing a recess in the electrode surface.

11. An electroactive elastomer converter according to claim 3, wherein the at least one opening in the electrode body electrode surface facing the elastomer layer has a concave shape, providing a recess in the electrode surface.

12. An electroactive elastomer converter according to claim 4, wherein the at least one opening in the electrode body electrode surface facing the elastomer layer has a concave shape, providing a recess in the electrode surface.

13. An electroactive elastomer converter according to claim 5, wherein the at least one opening in the electrode body electrode surface facing the elastomer layer has a concave shape providing a recess in the electrode surface.

14. An electroactive elastomer converter according to claim 1, wherein the electrode body comprises a metal sheet or metal foil.

15. An electroactive elastomer converter according to claim 2, wherein the electrode body comprises a metal sheet or metal foil.

16. An electroactive elastomer converter according to claim 3, wherein the electrode body comprises a metal sheet or metal foil.

17. An electroactive elastomer converter according to claim 4, wherein the electrode body comprises a metal sheet or metal foil.

18. An electroactive elastomer converter according to claim 5, wherein the electrode body comprises a metal sheet or metal foil.

19. An electroactive elastomer converter according to claim 6, wherein the electrode body comprises a metal sheet or metal foil.

20. An electroactive elastomer converter according to claim 7, wherein the electrode body comprises a metal sheet or metal foil.

21. An electroactive elastomer converter comprising:
at least one electroactive elastomer layer having a top side and underside and an electrically conductive electrode body connected in an area to the top side at least in regions, an electrically conductive electrode body connected in an area to the underside at least in regions, at least one electrode body including an electrode surface facing the elastomer layer with at least one opening including a two-dimensional region which is not bonded between the elastomer layer and the electrode body and into which the elastomer penetrates upon application of pressure thereto into the at least one opening and the at least one opening being bordered on one side by the elastomer layer with a gaseous compressible medium disposed in the at least one opening; and wherein the electrode body comprises an electrically conductive layer with at least one opening being a hole or perforation passing completely through the electrically conductive layer and having a diameter substantially equal to a thickness of the elastomer layer or the electrode body and each of the at least one recess and the elastomer layer encloses a gas-tight volume containing the gaseous compressible medium.

22. An electroactive elastomer converter according to claim 21, wherein the at least one opening is surrounded by a circular rim covering an area.

23. An electroactive elastomer converter according to claim 21, wherein at least two electroactive elastomer layers are stacked on top of each other, between each layer an electrode body is disposed having one side forming an electrode facing one of the elastomer layers containing at least one opening containing the compressible medium.

24. An electroactive elastomer converter according to claim 21, wherein at least two electroactive elastomer layers are stacked on top of each other, between each layer an electrode body is disposed having one side forming an electrode facing one of the elastomer layers containing at least one opening containing the compressible medium.

25. An electroactive elastomer converter according to claim 24, comprising flat electrode bodies divided into two groups with a first group of electrode bodies having openings and a second group of electrode bodies not having openings and the electrode bodies alternating in the direction of the stack.

26. An electroactive elastomer converter according to claim 21, wherein electroactive elastomer layers are arranged one on top of the other in a stack, between each of which an electrode body is disposed with at least one electrode body having an electrode surface on at least one side facing one of the elastomer layers and containing an opening in which the compressible medium is contained.

27. An electroactive elastomer converter according to claim 26, comprising at least two electrode bodies included with openings which overlap completely, partially overlap, or do not overlap in the direction of the stack.

28. An electroactive elastomer converter according to claim 21, wherein the compressible medium is air.

29. An electroactive elastomer converter according to claim 21 comprising an adaptive dynamic vibration absorber, to which an electrical voltage is applied between at least two electrode bodies bordering at least one elastomer layer on both sides and which alters a resonant vibration of the elastomer converter.

30. An electroactive elastomer converter according to claim 21 comprising at least one of a flat loudspeaker or an adjustable impedance, wherein an electrical control voltage is applied between at least two electrode bodies bordering at least one elastomer layer on both sides of the loudspeaker or impedance which influences vibration of the elastomer converter.

31. An electroactive elastomer converter according to claim 29, wherein at least two electrode bodies are disposed along an upper and/or a lower side of an elastomer layer to which an identical or an individually selected electrical voltage or control voltage is applicable.

* * * * *